United States Patent
Kuo et al.

(10) Patent No.: US 6,261,923 B1
(45) Date of Patent: Jul. 17, 2001

(54) METHOD TO SOLVE THE DISHING ISSUE IN CMP PLANARIZATION BY USING A NITRIDE HARD MASK FOR LOCAL INVERSE ETCHBACK AND CMP

(75) Inventors: Ming-Hong Kuo, Ping-Tung; Wei-Ray Lin, Taipei; Fu-Liang Yang, Tainan, all of (TW)

(73) Assignee: Vanguard International Semiconductor Corporation, Hsin-chu (TW)

( * ) Notice: Subject to any disclaimer, the term of this patent is extended or adjusted under 35 U.S.C. 154(b) by 0 days.

(21) Appl. No.: 09/225,379

(22) Filed: Jan. 4, 1999

(51) Int. Cl.[7] .................................................. H01L 21/762
(52) U.S. Cl. ............................................................. 438/427
(58) Field of Search ..................... 438/424, 427, 438/435, 437, 723, 738, 740

(56) References Cited

U.S. PATENT DOCUMENTS

| | | | |
|---|---|---|---|
| 4,962,064 | 10/1990 | Haskell et al. | 437/228 |
| 5,290,396 | 3/1994 | Schoenborn et al. | 156/636 |
| 5,356,513 | 10/1994 | Burke et al. | 156/636 |
| 5,441,094 | 8/1995 | Pasch | 156/636 |
| 5,575,886 | 11/1996 | Murase | 156/636 |
| 5,710,076 | * 1/1998 | Dai et al. | 438/427 |
| 5,721,172 | * 2/1998 | Jang et al. | 438/424 |
| 5,721,173 | 2/1998 | Yano et al. | 438/424 |
| 5,817,567 | * 10/1998 | Jang et al. | 438/427 |
| 5,960,306 | * 9/1999 | Hall et al. | 438/612 |
| 6,027,959 | * 2/2000 | En et al. | 438/723 |

* cited by examiner

*Primary Examiner*—Olik Chaudhuri
*Assistant Examiner*—Anh Duy Mai
(74) *Attorney, Agent, or Firm*—George O. Saile; Stephen B. Ackerman; Rosemary L. S. Pike

(57) ABSTRACT

A method for forming planarized isolation using a nitride hard mask and two CMP steps is described. A first nitride layer is deposited over a pad oxide layer on the surface of a semiconductor substrate. The first nitride and pad oxide layers are etched through where they are not covered by a mask to provide at least one wide opening and at least one narrow opening where the surface of the substrate is exposed. Trenches are etched into the substrate where it is exposed. An oxide layer is deposited overlying the first nitride layer and within the trenches completely filling the narrow trench wherein a trough is formed over the wide trench. A second nitride layer is deposited over the oxide layer. The second nitride layer is polished away with a polish stop at the oxide layer whereby the second nitride layer is removed except: where it lies within the trough. The oxide layer is etched back where it is not covered by the second nitride layer wherein the oxide layer is planarized except where the oxide layer underlies the second nitride layer. The second nitride layer is removed within the trough whereby oxide horns forming the trough extend vertically upward from the planarized oxide surface. Thereafter, the oxide layer is polished away with a polish stop at the first nitride layer whereby the oxide horns are removed. The first nitride and the pad oxide layers are removed completing formation of the shallow trench isolation.

21 Claims, 5 Drawing Sheets

METHOD TO SOLVE THE DISHING ISSUE IN CMP PLANARIZATION BY USING A NITRIDE HARD MASK FOR LOCAL INVERSE ETCHBACK AND CMP

BACKGROUND OF THE INVENTION

1. Field of the Invention

The present invention relates to the fabrication of integrated circuit devices, and more particularly, to a method of forming planarized shallow trench isolation (STI) in the fabrication of integrated circuits.

2. Description of the Prior Art

As device technology is scaled down to the quarter micron regime, the use of the conventional local oxidation of silicon (LOCOS) isolation will be confined by smaller channel-width encroachment (bird's beak). Shallow trench isolation (STI) can be used to eliminate these encroachments, especially in ultra large scale integrated (ULSI) circuit devices. To achieve good planarity after STI, chemical mechanical polishing (CMP) is often used. However, due to pad deformation, the trench open area is susceptible to dishing which causes oxide thinning in the wide trench.

A number of workers in the art have addressed the CMP planarization issue. U.S. Pat. No. 4,962,064 to Haskell et al and the prior art of U.S. Pat. No. 5,721,173 to Yano et al teach the use of a polysilicon hard mask layer in planarizing shallow trench isolation (STI). U.S. Pat. No. 5,356,513 to Burke et al uses a series of alternating "hard" and "soft" polishing layers for planarizing an oxide layer over a metal pattern. U.S. Pat. No. 5,290,396 to Schoenborn et al and U.S. Pat. No. 5,441,094 to Pasch disclose a silicon nitride hard mask and a one-step CMP process. U.S. Pat. No. 5,575,886 to Murase shows a global planarization process using CMP.

SUMMARY OF THE INVENTION

Accordingly, the primary object of the invention is to provide a process for forming planarized isolation in the fabrication of integrated circuits.

A further object of the invention is to provide a process for forming planarized isolation in which oxide dishing is eliminated.

Still another object is to provide a process for forming planarized isolation using a nitride mask and two CMP steps.

In accordance with the objects of the invention, a method for forming planarized isolation using a nitride hard mask and two CMP steps is achieved. A pad oxide layer is deposited on the surface of a semiconductor substrate. A first nitride layer is deposited overlying the pad oxide layer. The first nitride layer and pad oxide layer are etched through where they are not covered by a mask to provide openings where the surface of the semiconductor substrate is exposed wherein there is at least one wide opening and at least one narrow opening. A trench is etched into the semiconductor substrate where it is exposed within the wide and the narrow openings. An oxide layer is deposited overlying the first nitride layer and within the trenches wherein the narrow trench is completely filled and a trough is formed over the wide trench. A second nitride layer is deposited over the oxide layer. The second nitride layer is polished away with a polish stop at the oxide layer whereby the second nitride layer is removed except where it lies within the trough. The oxide layer is etched back where it is not covered by the second nitride layer wherein the oxide layer is planarized except where the oxide layer underlies the second nitride layer. The second nitride layer is removed within the trough whereby oxide horns forming the trough extend vertically upward from the planarized oxide surface. Thereafter, the oxide layer is polished away with a polish stop at the first nitride layer whereby the oxide horns are removed. The first nitride layer and the pad oxide layer are removed completing formation of the shallow trench isolation in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
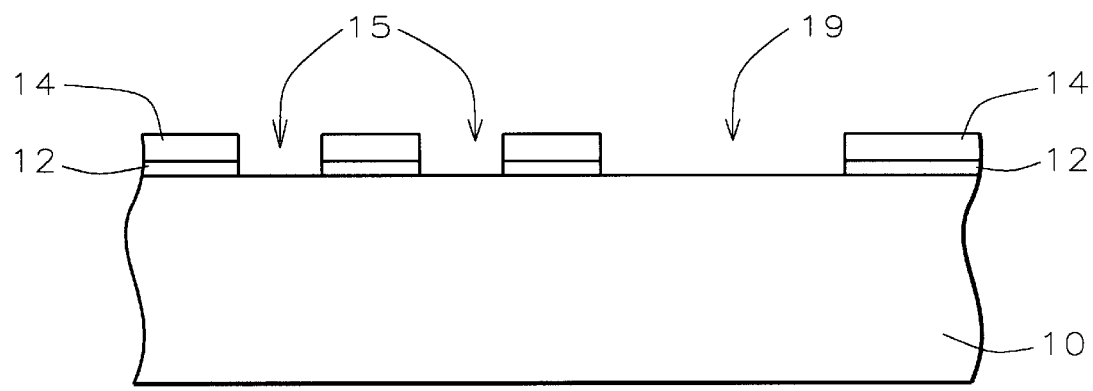
FIGS. 1 through 9 are cross-sectional representations of a preferred embodiment of the present invention.

Referring now more particularly to FIG. 1, there is shown a semiconductor substrate 10. A layer of pad silicon oxide 12 is grown on the surface of the semiconductor substrate to a thickness of between about 50 and 500 Angstroms. A layer of silicon nitride 14 is deposited over the pad oxide layer 12 to a thickness of between about 1000 and 3000 Angstroms.

A photoresist mask, not shown, is formed over the surface of the nitride layer wherein openings are left where the isolation regions are to be formed. Using conventional photolithography and etching techniques, the nitride and pad oxide layers are etched to expose the semiconductor substrate where the isolation regions are to be formed. These isolation regions include narrow regions such as 15 and wide regions such as 19. The narrow regions may be less than about 0.15 microns to about 10 microns in width and the wide regions may be more than about 1000 microns in width.

Figure 2:
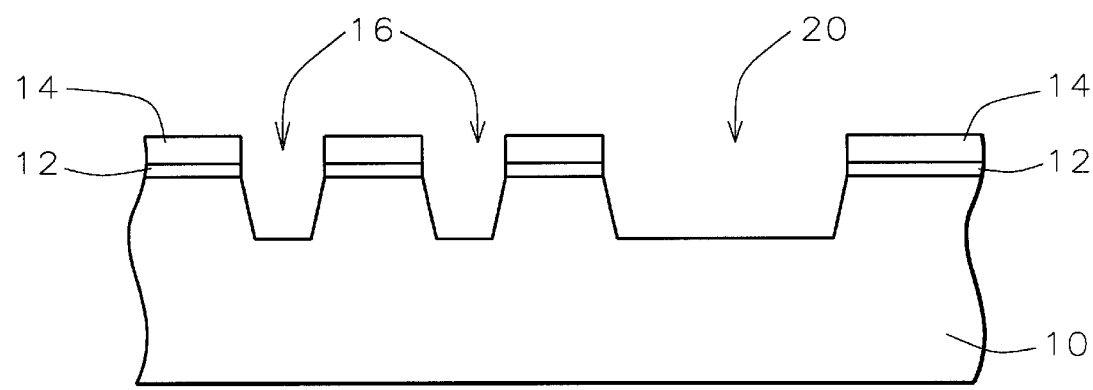

Referring now to FIG. 2, the semiconductor substrate exposed within the openings is etched into to a depth of between about 1500 and 4000 Angstroms to form narrow trenches 16 and wide trenches 20.

Figure 3:
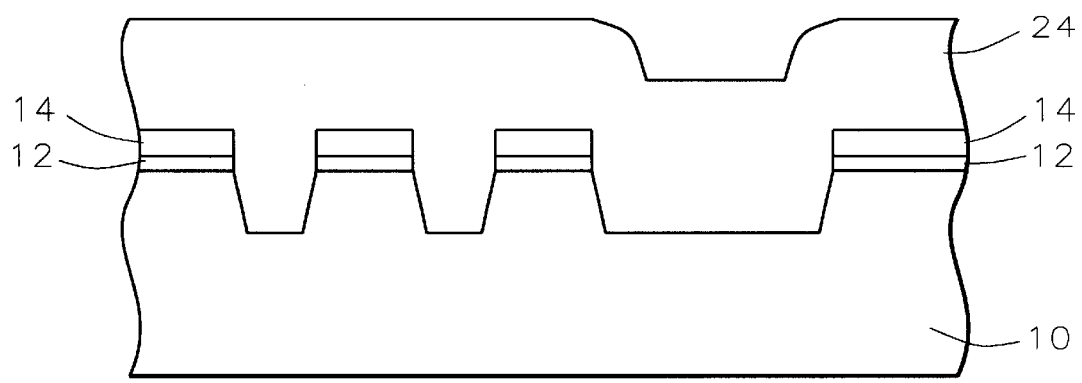

Referring now to FIG. 3, an oxide layer 24 is deposited by CVD over the surface of the substrate and filling the trenches. The oxide layer 24 has a thickness of between about 4000 and 8000 Angstroms.

It is desired to planarize the oxide layer without dishing of the wide trench areas. The innovative process of the present invention reduces dishing and increases the process window.

Figure 4:
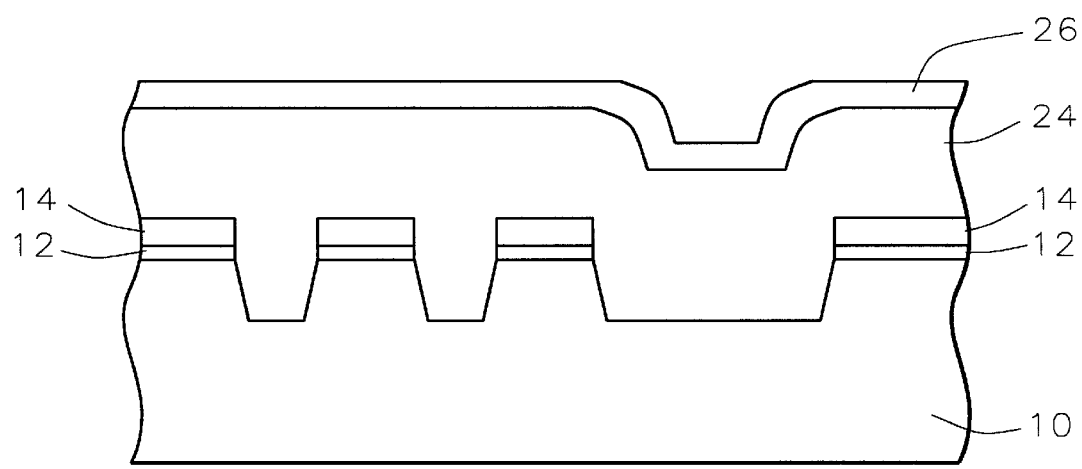

A layer of silicon nitride 26 is deposited over the oxide layer 24 to a thickness of between about 500 and 3000 Angstroms, as shown in FIG. 4.

Figure 5:
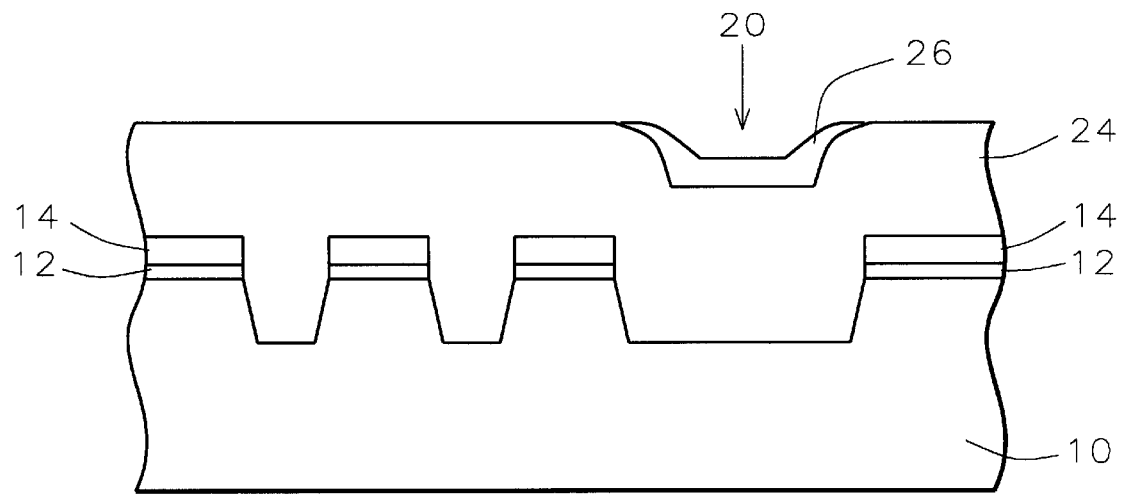

The silicon nitride layer 26 is now polished using CMP with a polish stop at the oxide layer 24, as illustrated in FIG. 5. This leaves the nitride layer 26 only over the wide trench 20. The silicon nitride layer 26 remaining forms an inverse etchback hard mask for the wide trench. Silicon nitride is chosen as the hard mask material because it has a CMP polish rate lower than that of oxide. This will ensure that the hard mask material remains covering the entire wide trench area.

Figure 6:
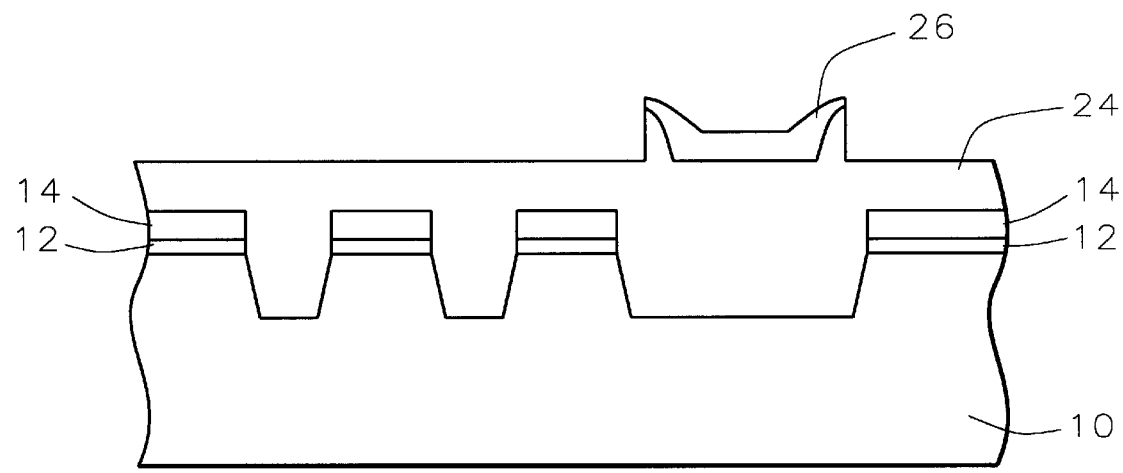

Now, the oxide layer 24 is etched back, using the silicon nitride layer 26 as a mask. For example, $CHF_3$, $CF_4$ and $O_2$ chemistry is used for etching back the oxide layer. The oxide etchback is performed in time mode. Approximately 1000 to 2000 Angstroms of the oxide layer is etched back in this step, as shown in FIG. 6.

Figure 7:
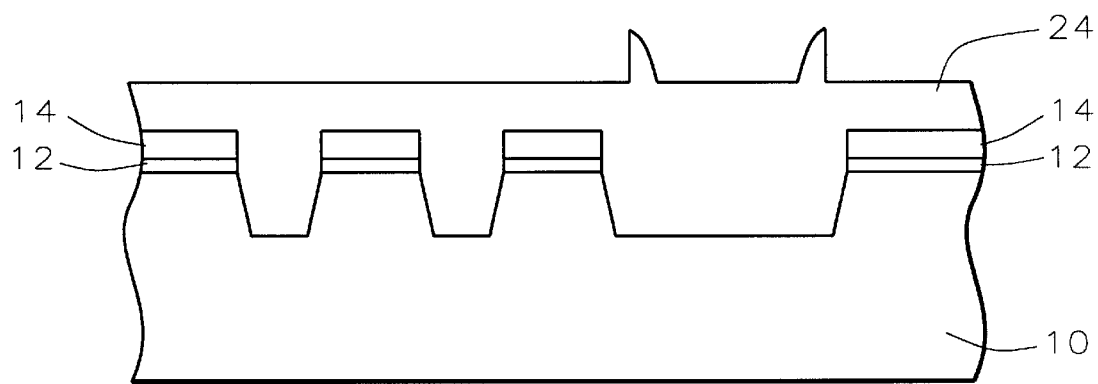

Referring now to FIG. 7, the nitride layer 26 is removed by a wet chemical process, such as hot $H_3PO_4$. This wet chemical removal of the hard mask prevents the oxide loss that would occur if CMP were used to remove the hard mask.

Figure 8:
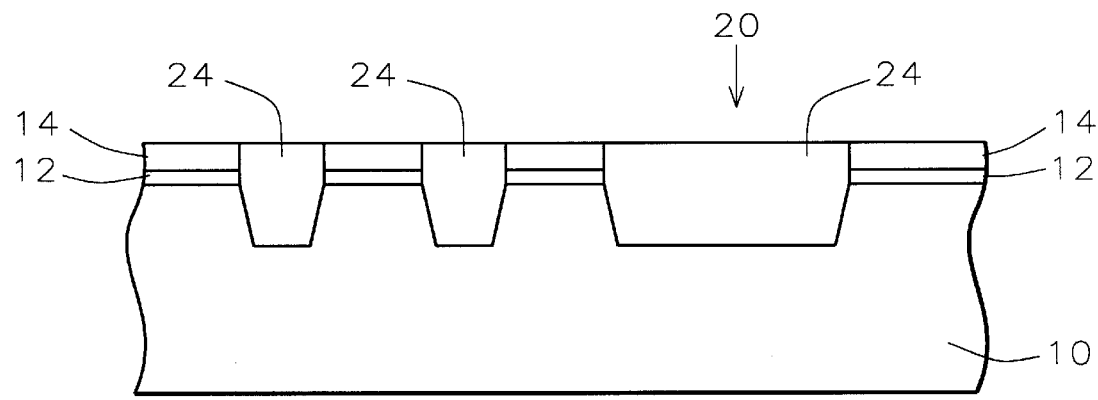

Next, the remaining oxide layer 24 is polished using chemical mechanical polishing (CMP), as shown in FIG. 8 with a polish stop at the silicon nitride layer 14.

Dishing over the wide trench 20 is eliminated because of the reduced oxide CMP time resulting from the innovation of the present invention. Reduced CMP time results in reduced dishing. The oxide "horns" shown in FIG. 7 will be removed very quickly during the CMP step.

Figure 9:
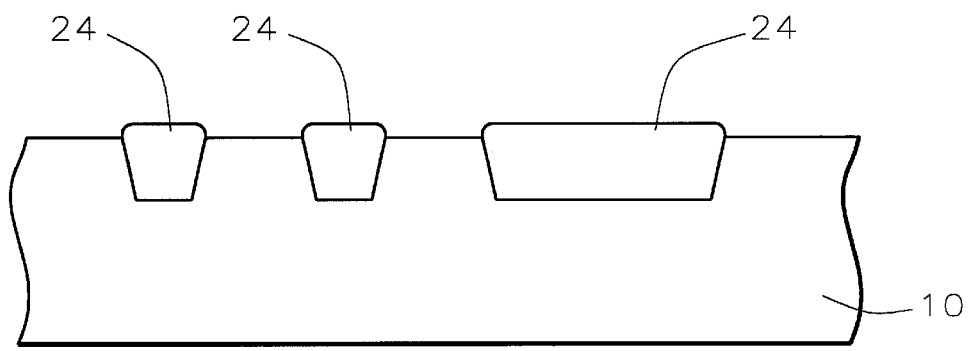

Finally, referring to FIG. 9, the silicon nitride layer 14 and pad oxide layer 12 are removed using a conventional wet etch. This completes the formation of the shallow trench isolation regions 24.

Figure 10:
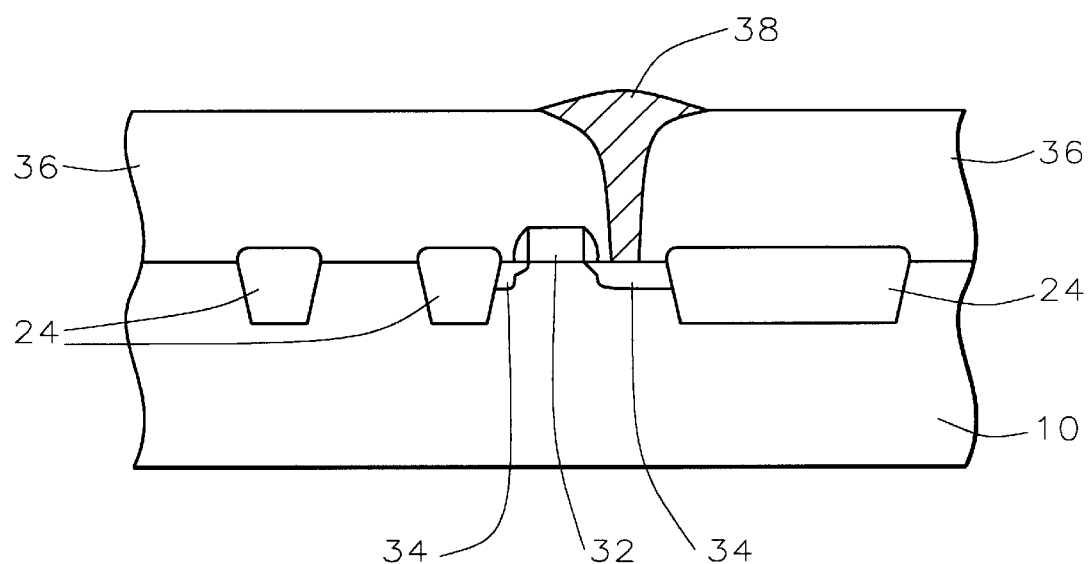
FIG. 10 is a cross-sectional representation of a completed integrated circuit device fabricated by the process of the present invention.

Processing continues as is conventional in the art. For example, semiconductor device structures, including gate electrodes 32 and source and drain regions 34 may be formed in the active regions between isolation regions as is conventional in the art. Electrical contacts 38 may be made through dielectric isolation layer 36, as shown in FIG. 10.

The process of the present invention results in the formation of planarized isolation without dishing over large areas by using an inverse etchback silicon nitride mask and two CMP process steps. The hard mask and the oxide trench fill material are polished in different steps, one material at a time. The CMP+etchback+CMP process of the present invention provides a larger process window.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation in the fabrication of an integrated circuit device comprising:

depositing a pad oxide layer on the surface of a semiconductor substrate;

depositing a first nitride layer overlying said pad oxide layer;

etching through said first nitride layer and said pad oxide layer where they are not covered by a mask to provide openings wherein the surface of said semiconductor substrate is exposed wherein there is at least one wide opening and at least one narrow opening;

etching a narrow trench into said semiconductor substrate where it is exposed within said narrow opening and etching a wide trench into said semiconductor substrate where it is exposed within said wide opening;

depositing an oxide layer overlying said first nitride layer and filling said narrow trench and said wide trench wherein said narrow trench is completely filled and wherein there is formed a trough over said wide trench;

depositing a second nitride layer over said oxide layer;

polishing away said second nitride layer with a polish stop at said oxide layer whereby said second nitride layer is removed except where it lies within said trough;

etching back said oxide layer where it is not covered by said second nitride layer using $CHF_3$, $CF_4$, and $O_2$ chemistry wherein said oxide layer is planarized except where said oxide layer underlies said second nitride layer;

removing said second nitride layer within said trough whereby oxide horns forming said trough extend vertically upward from said planarized oxide surface;

thereafter polishing away said oxide layer with a polish stop at said first nitride layer whereby said oxide horns are removed; and removing said first nitride layer and said pad oxide layer completing said formation of said shallow trench isolation in said fabrication of said integrated circuit device.

2. The method according to claim 1 wherein said pad oxide layer has a thickness of between about 50 and 500 Angstroms.

3. The method according to claim 1 wherein said first nitride layer is deposited to a thickness of between about 1000 and 3000 Angstroms.

4. The method according to claim 1 wherein said narrow opening has a width of between about 0.15 and 10 microns and wherein said wide opening has a width greater than about 1000 microns.

5. The method according to claim 1 wherein said trench has a depth of between about 1500 and 4000 Angstroms.

6. The method according to claim 1 wherein said oxide layer is deposited by low pressure chemical vapor deposition to a thickness of between about 4000 and 8000 Angstroms.

7. The method according to claim 1 wherein said second nitride layer is deposited to a thickness of between about 500 and 3000 Angstroms.

8. The method according to claim 1 wherein said step of polishing away said second nitride layer comprises chemical mechanical polishing (CMP).

9. The method according to claim 1 wherein said step of etching away said oxide layer etches away between about 1000 and 2000 Angstroms of said oxide layer.

10. The method according to claim 1 wherein said step of polishing away said oxide layer comprises chemical mechanical polishing (CMP).

11. The method according to claim 1 further comprising fabricating semiconductor device structures in and on said semiconductor substrate between said shallow trench isolation.

12. A method of forming shallow trench isolation in the fabrication of an integrated circuit device comprising:

depositing a pad oxide layer on the surface of a semiconductor substrate;

depositing a first nitride layer overlying said pad oxide layer;

etching through said first nitride layer and said pad oxide layer where they are not covered by a mask to provide openings wherein the surface of said semiconductor substrate is exposed wherein there is at least one wide opening and at least one narrow opening;

etching a narrow trench into said semiconductor substrate where it is exposed within said narrow opening and etching a wide trench into said semiconductor substrate where it is exposed within said wide opening;

depositing an oxide layer overlying said first nitride layer and filling said narrow trench and said wide trench wherein said narrow trench is completely filled and wherein there is formed a trough over said wide trench;

depositing a second nitride layer over said oxide layer;

polishing away said second nitride layer using chemical mechanical polishing (CMP) with a polish stop at said oxide layer whereby said second nitride layer is removed except where it lies within said trough;

etching back said oxide layer where it is not covered by said second nitride layer using $CHF_3$, $CF_4$, and $O_2$ chemistry wherein said oxide layer is planarized except where said oxide layer underlies said second nitride layer;

removing said second nitride layer within said trough whereby oxide horns forming said trough extend vertically upward from said planarized oxide surface;

thereafter polishing away said oxide layer using chemical mechanical polishing (CMP) with a polish stop at said first nitride layer whereby said oxide horns are removed and wherein no dishing occurs over said wide trench; and removing said first nitride layer and said pad oxide layer completing said formation of said shallow trench isolation in said fabrication of said integrated circuit device.

13. The method according to claim 12 wherein said pad oxide layer has a thickness of between about 50 and 500 Angstroms.

14. The method according to claim 12 wherein said first nitride layer is deposited to a thickness of between about 1000 and 3000 Angstroms.

15. The method according to claim 12 wherein said narrow opening has a width of between about 0.15 and 10 microns and wherein said wide opening has a width greater than about 1000 microns.

16. The method according to claim 12 wherein said trench has a depth of between about 1500 and 4000 Angstroms.

17. The method according to claim 12 wherein said oxide layer is deposited by low pressure chemical vapor deposition to a thickness of between about 4000 and 8000 Angstroms.

18. The method according to claim 12 wherein said second nitride layer is deposited to a thickness of between about 500 and 3000 Angstroms.

19. The method according to claim 12 wherein said step of etching away said oxide layer etches away between about 1000 and 2000 Angstroms of said oxide layer.

20. A method of forming shallow trench isolation in the fabrication of an integrated circuit device comprising:

depositing a pad oxide layer on the surface of a semiconductor substrate;

depositing a first nitride layer overlying said pad oxide layer;

etching through said first nitride layer and said pad oxide layer where they are not covered by a mask to provide openings wherein the surface of said semiconductor substrate is exposed wherein there is at least one wide opening and at least one narrow opening;

etching a narrow trench into said semiconductor substrate where it is exposed within said narrow opening and etching a wide trench into said semiconductor substrate where it is exposed within said wide opening;

depositing an oxide layer overlying said first nitride layer and filling said narrow trench and said wide trench wherein said narrow trench is completely filled and wherein there is formed a trough over said wide trench;

depositing a hard mask layer over said oxide layer wherein said hard mask layer has a CMP polish rate lower than the CMP polish rate of said oxide layer;

polishing away said hard mask layer using chemical mechanical polishing (CMP) with a polish stop at said oxide layer whereby said hard mask layer is removed except where it lies within said trough;

etching back said oxide layer where it is not covered by said hard mask layer using $CHF_3$, $CF_4$, and $O_2$ chemistry wherein said oxide layer is planarized except where said oxide layer underlies said hard mask layer;

removing said hard mask layer within said trough;

thereafter polishing away said oxide layer using chemical mechanical polishing (CMP) with a polish stop at said first nitride layer whereby said oxide layer is planarized and wherein no dishing occurs over said wide trench; and removing said first nitride layer and said pad oxide layer completing said formation of said shallow trench isolation in said fabrication of said integrated circuit device.

21. The method according to claim 20 wherein said hard mask layer comprises silicon nitride.

* * * * *